US008837292B2

(12) United States Patent
Lu et al.

(10) Patent No.: US 8,837,292 B2
(45) Date of Patent: Sep. 16, 2014

(54) RELAYED CSPF COMPUTATION FOR MULTIPLE AREAS AND MULTIPLE AUTONOMOUS SYSTEMS

(75) Inventors: Wenhu Lu, San Jose, CA (US); Sriganesh Kini, Fremont, CA (US); Srikanth Narayanan, San Jose, CA (US)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 311 days.

(21) Appl. No.: 12/983,123

(22) Filed: Dec. 31, 2010

(65) Prior Publication Data

US 2012/0069740 A1    Mar. 22, 2012

Related U.S. Application Data

(60) Provisional application No. 61/384,774, filed on Sep. 21, 2010.

(51) Int. Cl.
*H04W 40/00*    (2009.01)
*H04L 12/717*   (2013.01)
*H01L 45/00*    (2006.01)
*H04L 12/723*   (2013.01)
*H04L 12/725*   (2013.01)

(52) U.S. Cl.
CPC ............... *H04L 45/30* (2013.01); *H04L 45/42* (2013.01); *H01L 45/04* (2013.01); *H04L 45/50* (2013.01)
USPC ............................ 370/238; 370/248; 370/351

(58) Field of Classification Search
USPC .......................................... 370/238, 248, 351
See application file for complete search history.

(56) References Cited

U.S. PATENT DOCUMENTS

| 6,597,663 | B1 * | 7/2003 | Rekhter ........................ 370/252 |
| 2006/0171320 | A1 * | 8/2006 | Vasseur et al. ................ 370/238 |
| 2006/0200579 | A1 * | 9/2006 | Vasseur et al. ................ 709/238 |

OTHER PUBLICATIONS

Bitar et al.: "Inter-AS Requirements for the Path Computation Element Communication Protocol (PCECP); rfc5376.txt", Inter-As Requirements for the Path Computation Element Communication Protocol (PCECP); RFC5376.txt, Internet Engineering Task Force, IETF; Standard, Internet Society (ISOC) 4, Rue Des Falaises CH1205 Geneva, Switzerland, Nov. 1, 2008, 15 pages.

(Continued)

*Primary Examiner* — Xavier Szewai Wong
*Assistant Examiner* — Natali N Pascual Peguero
(74) *Attorney, Agent, or Firm* — Blakely Sokoloff Taylor & Zafman LLP

(57) ABSTRACT

Computing a constraint-based label switched path (LSP) that spans multiple areas is described. In one embodiment, a router in a first one of the multiple areas computes a path segment that meets a set of one or more constraints to at least one border router of the first area that lies in a path necessary to reach the destination. The router transmits a path computation request message to a path computation element (PCE) in a second one of the areas, which includes a set of one or more attributes for each computed path segment that are used by the PCE to compute one or more path segments towards the destination of the constraint-based LSP. The router receives a path computation reply message from the PCE that specifies a set of one or more computed path segments that meet the set of constraints and that were computed by one or more PCEs downstream from the router. The router stitches at least one of the set of computed path segments that are specified in the path computation reply message with the path segment computed by the router to form at least part of the constraint-based LSP.

21 Claims, 8 Drawing Sheets

(56) References Cited

OTHER PUBLICATIONS

JP Vasseur et al.: "Path Computation Element (PCE) Communication Protocol (PCEP); rfc5440.txt", Path Computation Element (PCE) Communication Protocol (PCEP); RFC5440.txt, Internet Engineering Task Force, IETF; Standard, Internet Society (ISOC) 4, Rue Des Falaises CH- 1205 Geneva, Switzerland, Mar. 1, 2009, 87 pages.

Vasseur et al., A Backward-Recursive PCE-Based Computation (BRPC) Procedure to Compute Shortest Constrained Inter-Domain Traffic Engineering Label Switched Paths, Network Working Group, Request for Comments: 5441, Apr. 2009, 18 pages.

Vasseur et al., RSVP Path computation request and reply messages, Network Working Group, Internet Draft, draft-vasseur-mpls-computation-rsvp-05.txt, Jul. 2004, 23 pages.

* cited by examiner

```
 0                   1                   2                   3
 0 1 2 3 4 5 6 7 8 9 0 1 2 3 4 5 6 7 8 9 0 1 2 3 4 5 6 7 8 9 0 1
+-+-+-+-+-+-+-+-+-+-+-+-+-+-+-+-+-+-+-+-+-+-+-+-+-+-+-+-+-+-+-+-+
| Type  |     Len       |           Node-ID                     |
+-+-+-+-+-+-+-+-+-+-+-+-+-+-+-+-+-+-+-+-+-+-+-+-+-+-+-+-+-+-+-+-+
|   Node-ID (Cont)      |   Sub-Type    |    Sub-Len            |
+-+-+-+-+-+-+-+-+-+-+-+-+-+-+-+-+-+-+-+-+-+-+-+-+-+-+-+-+-+-+-+-+
|     Seg-ID            |       Cost                            |
+-+-+-+-+-+-+-+-+-+-+-+-+-+-+-+-+-+-+-+-+-+-+-+-+-+-+-+-+-+-+-+-+
|   Cost (Cont)         |      Hops     |    Sub-Type           |
+-+-+-+-+-+-+-+-+-+-+-+-+-+-+-+-+-+-+-+-+-+-+-+-+-+-+-+-+-+-+-+-+
|                       Sub-Type #1                             |
+-+-+-+-+-+-+-+-+-+-+-+-+-+-+-+-+-+-+-+-+-+-+-+-+-+-+-+-+-+-+-+-+
//                          . . .                              //
+-+-+-+-+-+-+-+-+-+-+-+-+-+-+-+-+-+-+-+-+-+-+-+-+-+-+-+-+-+-+-+-+
|                       Sub-Type #M                             |
+-+-+-+-+-+-+-+-+-+-+-+-+-+-+-+-+-+-+-+-+-+-+-+-+-+-+-+-+-+-+-+-+
                    Relay Content
                   Extension Format
                         210
```

FIG. 2

```
Sending PCReq:
For (PCE_Elect of each border area) {
    send_PCReq(PCE_Elect, path_Req_Info, seeds_of_BNs);
    add_to_PCReq_Pending_List(PCE_Elect);
    if (relay_timer==NULL) {
        create_relay_timer();
    }
}

Receiving PCRep:
PCE_Elect = lookup(PCRep's source address);
path = retrieve_from(PCRep, PCE_Elect);
best_path = better_path(best_path, path);
remove_from_PCReq_Pending_List(PCE_Elect);
if (Pending_List==NULL) {
    Cancel_timer(relay_timer);
    if (self==Headend) {
        terminate;
    } else {
        send_PCRep(best_path, upstream_PCE);
    }
}

Relay Timer Expires:
cleanup_Pending_List();
if (Pending_List==NULL) {
    Cancel_timer(relay_timer);
    if (self==Headend) {
        terminate;
    } else {
        send_PCRep(best_path, upstream_PCE);
    }
}
```

FIG. 7

RELAYED CSPF COMPUTATION FOR MULTIPLE AREAS AND MULTIPLE AUTONOMOUS SYSTEMS

CROSS-REFERENCE TO RELATED APPLICATIONS

This application claims the benefit of U.S. Provisional Application No. 61/384,774, filed Sep. 21, 2010, which is hereby incorporated by reference.

FIELD

Embodiments of the invention relate to the field of networking; and more specifically, for computing a constraint-based label switched path (LSP) that spans across multiple areas and/or multiple autonomous systems.

BACKGROUND

The demand for the ability for computing label switched paths (LPSs) that span across multiple areas or multiple autonomous systems has evolved from an academic discussion to a feature request of a carrier network. There have been a few solutions that have been proposed for computing constraint based LSPs that span across multiple areas or multiple autonomous systems.

In one proposed solution, a global TE (traffic engineering) database is used. While the global TE database is a simple solution for computing LSPs that span across multiple areas or multiple ASes, it is prohibitive because the global TE database may be too large and therefore negates the purpose of having multiple areas or multiple ASes, and it violates the information hiding and confidentiality requirement, which is unacceptable by Internet Service Providers (ISPs).

Another proposed solution uses a crankback method. The crankback method is more practical than the global TE database solution as it is an exhaustive search based mechanism and will find an LSP if it exists. However, the crankback method also includes obvious drawbacks. One drawback is that the crankback method does not scale because it often requires, and therefore wastes, more than one tryout to find a qualified LSP; and it is RSVP (Resource Reservation Protocol) signaling based which is by its nature poor in scaling. Another drawback is that the extra signaling messages used in the crankback method adds burdens on the existing network. Another drawback is that the path, if found, is not guaranteed to be optimal. Another drawback is that the crankback method is labor intensive in that it requires many manual configurations to specify border routers. Finally, another drawback is that the crankback method requires substantial RSVP changes, both in protocol and operation.

Another proposed solution is described in RFC (Request For Comments) 5441, "A Backward-Recursive PCE-Based Computation (BRPC) Procedure to Compute Shortest Constrained Inter-Domain Traffic Engineering Label Switched Paths," April 2009. The solution proposed in RFC 5441 assumes that the destination is known in a particular domain and area; however this assumption is not always true. Moreover, the destination may be multi-homed (meaning reachable through different areas and domains), which the RFC 5441 method cannot handle. Furthermore, the method described in RFC 5441 mandates a PCEP (Path Computation Element Protocol) extension which understands the Virtual Shortest Path Tree (VSPT), which further complicates the method. Moreover, the VSPT approach only addresses one destination at a time.

SUMMARY

A method in a router for participating in computation of a constraint-based label switched path (LSP) that spans multiple areas to reach a destination, where the router is included within a first one of the areas, is described. In one embodiment, the router computes a path segment that meets a set of one or more constraints to at least one border router of the first area. The at least one border router lies in a path necessary to reach the destination. The router transmits a path computation request message to a path computation element in a second one of the areas. The path computation request message includes a set of one or more attributes for each computed path segment that are used by the path computation element to compute one or more path segments towards the destination of the constraint-based LSP. The router receives a path computation reply message from the path computation element that specifies a set of one or more computed path segments that meet the set of constraints and that were computed by one or more path computation elements downstream from the router. The router stitches at least one of the set of computed path segments that are specified in the path computation reply message with the path segment computed by the router to form at least part of the constraint-based LSP.

In another embodiment, a router that resides in a first one of multiple areas participates in computation of a constraint-based LSP that spans multiple areas. The destination also is in the first area. The router receives a path computation request message from a router residing in a second one of the areas. The path computation request message includes a set of one or more attributes for each of a set of one or more path segments that were computed by the router in the second area to a set of one or more border routers. The router computes a set of one or more path segments to the destination using the set of attributes for each of the set of path segments that were computed by the router residing in the second area. The router transmits a path computation reply message to the router residing in the second area. The path computation reply message specifies the set of computed path segments to the destination and a set of one or more attributes for each computed path segment to the destination.

BRIEF DESCRIPTION OF THE DRAWINGS

The invention may best be understood by referring to the following description and accompanying drawings that are used to illustrate embodiments of the invention. In the drawings:

FIG. 2 illustrates an exemplary extension to the PCEP (PCE Communication Protocol) for encoding the seed information of a path segment calculation according to one embodiment;

FIG. 7 illustrates exemplary pseudo code of a relay timer logic according to one embodiment;

DESCRIPTION OF EMBODIMENTS

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other.

A method and apparatus for computing a constraint-based label switched path (LSP) that spans across multiple areas or multiple autonomous systems is described. In one embodiment, for an LSP that is to span across multiple areas or multiple autonomous systems, the path computation elements (PCEs) in the multiple areas or multiple autonomous systems cooperate to determine the path (if one exists). An upstream PCE, while incapable of performing the path computation for a tailend of the LSP outside of its domain, provides the history of its computation to its downstream PCE which then assumes the computation job. The downstream PCE may also send its history to another downstream PCE until the path is fully computed.

Figure 1:
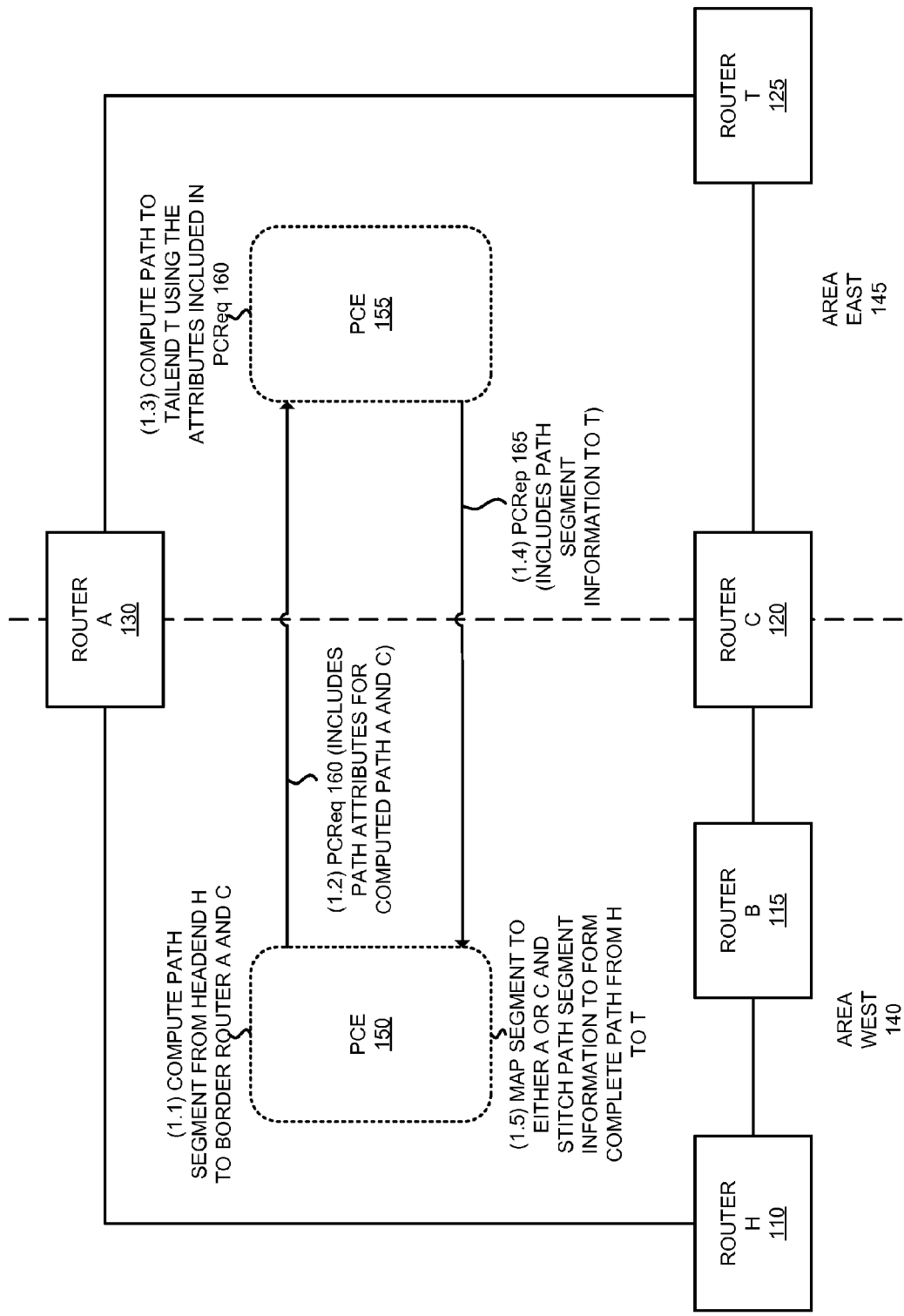
FIG. 1 is a data flow diagram illustrating computing a constraint-based LSP that spans across multiple areas according to one embodiment.

FIG. 1 is a data flow diagram illustrating computing a constraint-based LSP that spans across multiple areas according to one embodiment. The exemplary topology illustrated in FIG. 1 includes the area west 140 and the area east 145 divided by a dashed line. Although only two areas are shown, the invention is not limited to only two areas as there may be more than two areas that the LSP spans across. The router H 110 and router B 115 are located within the area west 140. The router H 110 is the headend of the LSP. The router T 125 is located within the area east 145. The router T 125 is the tailend of the LSP. The router A 130 and the router C 120 are border routers. Thus, the LSP is being computed from the headend router H 110 to the tailend router T 125.

The area west 140 includes the PCE 150 and the area east includes the PCE 155. The PCE 150 can be included within the router H 110, the router B 115, the router A 130, the router C 120, or in another network device within the area west 140. The PCE 155 can be included within the router A 130, the router C 120, the router T 125, or in another network device within the area east 145. The PCE 150 has access to only the information in the TE database of the area west 140 (the headend area). Because of this, and due to the nature of IGP (Interior Gateway Protocol) (e.g., OSPF (Open Shortest Path First), IS-IS (Intermediate System to Intermediate System)), the tailend router T 125 in area east 145 is not visible to the PCE 150 in the area west 140.

The router A 130 and the router C 120 are area border routers (sometimes referred herein as border nodes (BN)). An area border router lies in a necessary path to the destination in the next area or areas beyond (however it should be understood that although an area border may lie in a path to the destination, this path may not be the one ultimately chosen if a more optimal route exists). As illustrated in FIG. 1, the router A 130 and the router C 120 lie in paths to reach the router T 125 from the router H 110. Specifically, there is a path from the router H 110 to router A 130 to router T 125, and another path from the router H 110 to router B 115 to router C 120 to router T 115.

In order to compute the constraint-based LSP across the areas west 140 and 145, the PCE 150 performs part of the computation by computing paths from the headend router H 110 to the border router A 130 and the border router C 120 (assuming that these paths meet the constraints of the constraint-based LSP). These computed paths are referred herein as path segments since they are a segment of a complete path to the tailend router 125. The PCE 150 then provides the result of that computation to the PCE 155. The PCE 155 uses that information to conclude the path computation to the tailend router T 125. Thus, the path computation proceeds as a relayed CSPF (Constrained Shortest Path First) job, one in the area west 140 and the other in the area east 145. As described herein, a PCE has the capability to generate and send path computation request (PCReq) messages, receive and process PCReq messages, generate and send path computation reply (PCRep) messages, and receive and process PCRep messages.

Since the router A 130 and router C 120 are border routers to the area east 145, they are chosen to be a choice of an initial seed set for the CSPF computation. The PCE 150 includes information that provides it with each of the area's border routers (which can be provided by through IGP protocols and their TE extensions). CSPF, or more generally SPF (Shortest Path First), is a seed based algorithm and the SPT (Shortest Path Tree) for the area west 140 is built on these seeds. At operation 1.1, the PCE 150 computes a path segment from the headend router H 110 to the router A 130 that meet the set of constraints for the LSP, and computes a path segment from the headend router H 110 to the router C 120 that meet the set of constraints for the LSP.

At operation 1.2, the PCE 150 sends a path computation request (PCReq) message to the PCE 155 with information regarding its computation of the path segments to router A 130 and router C 120 that allows the PCE 155 to continue the path computation to the tailend router T 125. This information includes the path request information (e.g., the set of constraints) as well as path attributes of the computed segments to the router A 130 and the router C 120 such as cost, bandwidth, admin-group, hop-count, etc. Using this information, the PCE 155 computes a path towards the tailend router T 125 that meets the set of constraints.

Although FIG. 1 illustrates a single PCE 155 in the area east 145, in certain circumstances there may be multiple PCEs in the area east 145. In such a circumstance, only one of the PCEs need to be sent the PCReq message to avoid the waste and contention of computation resources. In one embodiment, the PCE 150 performs an election mechanism to select one of the eligible PCEs. The elected PCE can be any router or can be a dedicated PCE (it does not have to be a transit router). In one embodiment, any tie-breaker algorithm can be used to perform the election (e.g., choose the router with the highest or lowest router ID).

FIG. 2 illustrates an exemplary extension to the PCEP (PCE Communication Protocol), described in RFC 5440, "Path Computation Element (PCE) Communication Protocol (PCEP)", March 2009, for encoding the seed information of a path segment calculation according to one embodiment. As illustrated in FIG. 2, the relay content extension format 210 is in a TLV (type-length-value) format. The type field 215 is a one byte value that indicates that this message is for a relayed CSPF computation. The length field 220 is a one byte value that provides the actual length of the extension. The node-id field 225 is a four byte value that provides the border router's node identifier. Also included in the relay content extension 210 are one or more sub-TLVs that encode the segment information. Each sub-TLV includes a sub-type field 230, which is a one byte field that encodes a value that indicates the sub-TLV includes segment information, a sub-length field 235, which is a one byte field that encodes a length value of the sub-TLV (e.g., a length of 6), a segment identifier field 240, which is a one byte field that provides an identifier for the segment (since a border router can have multiple segment paths to it, this segment identifier allows for each segment to be distinguished and is used when accommodating additive constraints), a cost field 245 which provides the cost of the segment, and a hops-field 250 which provides the number of hops on the segment. In one embodiment, the admin-group and bandwidth information is not carried in the relay content extension 210 since they can be learned from the standard path request information fields.

Referring back to FIG. 1, sometime after receiving the PCReq message 160, at operation 1.3, the PCE 155 of the area east 145 uses the path information in the PCReq message 160 to the router A 130 and the router C 120 when computing the path to the tailend router T. For example, the PCE 155 deposits the path information to its SPF heap and performs the path computation to the tailend router T 125.

Figure 4:
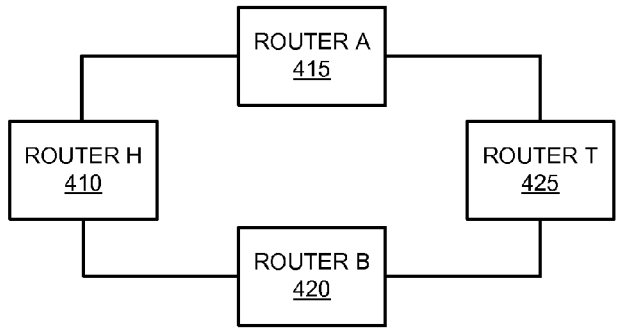
FIG. 4 illustrates the shortest path tree (SPT) equivalence property of an SPF (shortest path first) heap according to one embodiment.

When performing the path computation, the PCE 155 may take advantage of one or more properties associated with an SPF heap. One property of an SPF heap is that a heap with an initial seed is equivalent to that with multiple intermediate seeds in any SPF stages for the destinations that have not yet been reached (referred to as shortest path tree (SPT) equivalence). During normal SPF cycles, the heap will change and the path tree will grow. At any particular SPF cycle, the path tree records the reachability to certain destinations, which is important to generic SPF applications such as IGP routing protocols (e.g., OSPF, IS-IS). In IGP, all destinations must be included, whether they come out of the heap early or late, and none of those can be neglected. However, in CSPF, since only the targeted destinations are of importance, non-relevant records can be discarded during computation. Thus, the early path tree records that are insignificant can be disregarded. Therefore, for the selected destinations, the expanded heap with multiple seeds is equivalent with the heap at the initial stage. FIG. 4 illustrates this concept. With normal SPF computation, the headed node router H 410 is used an initial seed to the SPF heap. The final SPT provides reachability to the router A 415, router B 420, and to the tailend router T 425. If the computation uses the router A 415 and router B 420 as deposit seeds, the computation will result in an SPT with the same reachability for the tailend router T 425. The difference between the two SPTs is the reachability from the headend router H 410 to the router A 415 and the router B 420.

Figure 5:
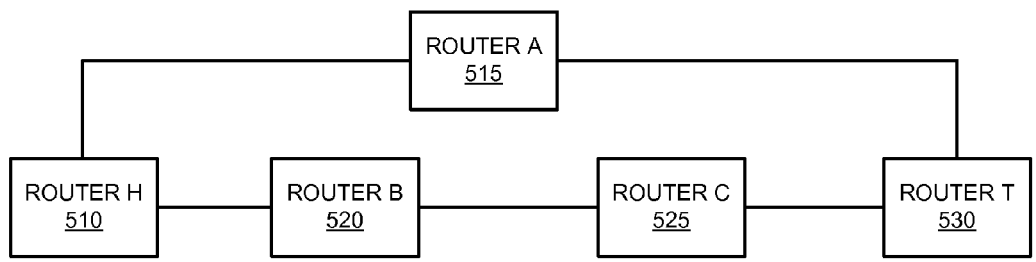
FIG. 5 illustrates the seed deposit timing property of an SPF heap according to one embodiment.

Another property of an SPF heap is that the deposit time of seeds is insensitive to destinations that have not yet been reached, provided that the seeds carry the correct attributes such as cost and nexthop (referred to as the seed deposit timing property). This property means indicates that the seed deposit time does not change its SPT contribution for destinations that have not yet been reached. FIG. 5 illustrates this concept. The exemplary network in FIG. 5 includes the headend router 510, the router A 515, the router B 520, the router C 525, and the tailend router T 530. The headend router 510 is directly coupled with the router A 515 and the router B 520. The router B 520 is also directly coupled with the router C 525, which is itself directly coupled with the tailend router T 530. The router A 515 is also directly coupled with the tailend router T 530. Because of this property, when computing a path to the tailend router T 530, an identical result is provided when using the seed set of the router A 515 and the router B 520, or when using the seed set of the router A 515 and the router C 525.

Figure 6:
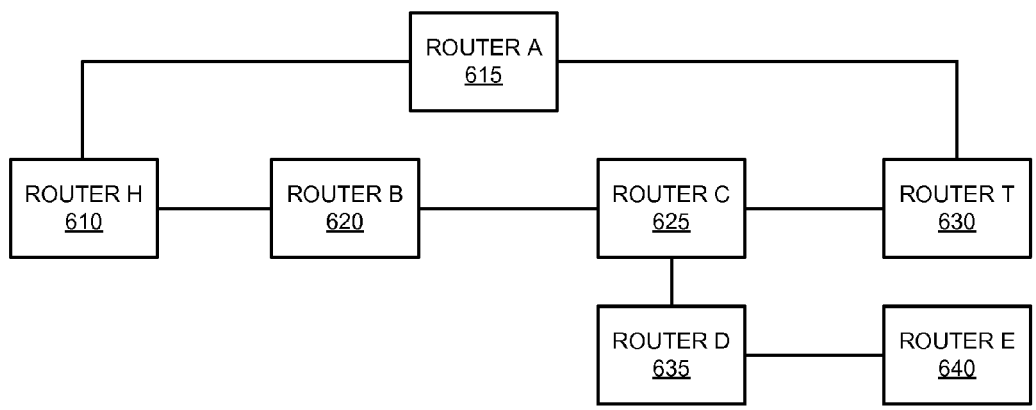
FIG. 6 illustrates the seed set reduction property of an SPF heap according to one embodiment.

Another property of an SPF heap is that the multiple seeds in the SPT equivalence property can further be reduced to those that constitute a set of nodes besides which the destinations are not viable (referred as the seed set reduction property). This allows those seeds that will not contribute to the path to be removed. FIG. 6 illustrates this concept. The exemplary network in FIG. 6 includes the headend router 610, router A 615, router B 620, router C 625, router D 635, router E 640, and the tailend router T 630. The headend router H 610 is directly coupled with the router A 615 and the router B 620. The router B 620 is also directly coupled with the router C 625. The router C 625 is also directly coupled with the router D 635 and the tailend router T 630. The router D 635 is also directly coupled with the router E 640, and router A 615 is also directly coupled with the tailend router T 630. For the reachability to the tailend router T 630, the initial seed of the headend router H 610 can be replaced with the router A 615 and the router B 620 per the SPT equivalence property. These two seeds can further be replaced with the seed set of router A 6 15, router C 625, and router D 635 per the seed deposit timing property. Since D will not contribute to the path to the tailend router T 630, the seed set can further be reduced to the seed set of router A 615 and router C 625.

Sometime after finding finishing the computation to the tailend router T 125, at operation 1.4, the PCE 155 sends a path computation reply (PCRep) message 165 back to the PCE 150. The PCRep message 165 includes its path segment information for the computed path to the tailend router T 125. The PCE 150 then at operation 1.5, using the information in the PCRep message 165, maps the path segment to one of the router A 130 and the router C 120 and stitches the segment to the one in the area west 140 to form a complete path to the tailend router T 125. For example, assuming that the PCRep message 165 includes path segment information from the router A 130 to the tailend router T 125, the PCE 150 maps that segment to the router A 130 and stitches the segments together such that the complete path is from the headend router H 110 to the router A 130 to the tailend router T 125.

It should be understood that although the example illustrated in FIG. 1 is for only two areas, the destination may be in an area further east than the area east 145. In such a case, the PCE 155 will relay the PCReq to a PCE further downstream, which will either find the target destination or continue to relay the job. The stitching proceeds in a similar manner, but in a reversed order.

Figure 3:
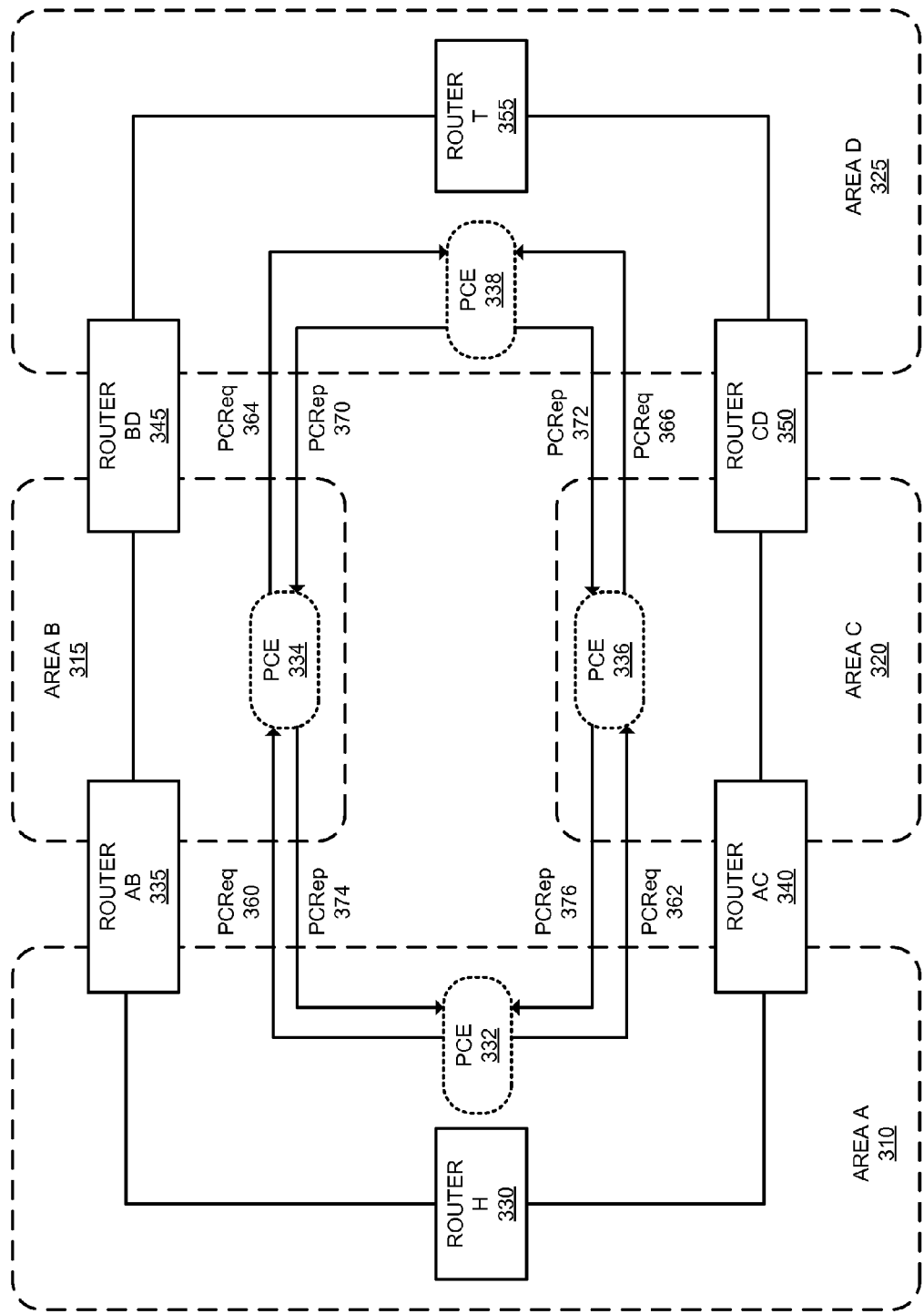
FIG. 3 illustrates a network where the tailend router T is reachable through multiple areas according to one embodiment.

FIG. 1 illustrated the destination being in a single area. However, in some circumstances, the destination may be multi-homed and viable through multiple areas. FIG. 3 illustrates a network where the tailend router T 355 is reachable through multiple areas (area B 315 and area C 320). Area A 310 includes the headend router H 330 and the PCE 332. Area B 315 includes the PCE 334. Area C includes the PCE 336. Area D includes the tailend router T 355 and the PCE 338. Area A 310 is connected with the area B 315 through the border router AB 335, and is connected with the area C through the border router AC 340. Area B 315 is connected with the area D 325 through the border router BD 345. Area C 320 is connected with the area D 325 through the border router CD 350.

The computation of the path from the router H 330 performs in a similar way as described with reference to FIG. 1, however, to maximize the path availability and optimality, in one embodiment the path computation request message is sent to each neighboring area and to each area's PCE elect. Thus, the PCE 332 sends a PCReq message 360 to the PCE 334 and sends a PCReq message 362 to the PCE 336. These two PCReq messages are different. The PCReq message 360 sent to the PCE 334 encodes the seeds of the routers between the headend router H 330 and the router AB 335 and the PCReq message 362 sent to the PCE 336 encodes the seeds of the routers between the headend router H 330 and the router AC 340. The PCE 334 and the PCE 336 perform their computation to the tailend router T 355 based on the information in the PCReq messages 360 and 362 respectively. The PCE 334 then sends the PCReq message 364 to the PCE 338 and the PCE 336 sends the PCReq message 366 to the PCE 338. The PCE 338 treats the received PCReq messages separately and computes a path to the tailend router T 355 separately. The PCE 338 then transmits the PCRep message 370 to the PCE 334 and transmits the PCRep message 372 to the PCE 336. The PCE 334 transmits the PCRep message 374 to the PCE 332 and the PCE 336 transmits the PCRep message 376 to the PCE 332. It should be understood that the sending of multiple PCReq messages is not limited to the PCE in the area of the headend. In other words, a PCE in an intermediate area can send multiple PCReq messages if they have multiple border routers to multiple areas.

In one embodiment, since the PCE 332 may receive multiple responses that encode a path to the tailend router T 355, the PCE 332 implements a timer to allow a reasonable wait time to collect all possible PCRep messages to accommodate the potential of a race condition for the multiple paths to the destination. A PCE that receives a PCReq message should send a PCRep back to the requester whether it finds a path or not. However, the PCRep message may take time to generate and it may be lost during transit. Because of this, in some embodiments the requesting PCE initiates a relay timer so that it will not wait indefinitely if the PCRep message never arrives.

FIG. 7 illustrates sample pseudo code of the timer logic according to one embodiment. As illustrated in FIG. 7, the pseudo code is separated into three sections: sending a PCReq message, receiving a PCRep message, and the relay timer expiring. When sending a PCReq message, the requesting PCE, for each PCE elect of each border area, sends a PCReq message to that PCE elect and includes the path request information (e.g., the set of constraints) and the seeds of the border routers. The requesting PCE then adds the PCE elect to a PCReq pending list and creates a relay timer if one does not already exist.

Upon receiving a PCRep message, the requesting PCE looks up the source address of the PCRep and determines the path encoded in the PCRep message. The PCE then determines whether that path is better than a previous path to the destination it has received (and sets the better path as the best path). The PCE removes the PCE that sent the PCRep message from the PCReq pending list. If that makes the PCReq pending list to be empty, then the relay timer is cancelled and if the requesting PCE is the headend (or in the headend area), then the process terminates, otherwise the requesting PCE sends a PCRep with the best path to an upstream PCE.

Upon the relay timer expiring, the requesting PCE cleans up the PCReq pending list For example, the requesting PCE deletes those entries for which the requesting PCE is still waiting for a PCRep message. If the PCReq pending list is empty, then the relay timer is cancelled and if the requesting PCE is the headend (or in the headend area), then the process terminates, otherwise the requesting PCE sends a PCRep with the best path to an upstream PCE.

While FIG. 1 described an LSP spanning multiple areas in the same autonomous system, an LSP can also span across multiple autonomous systems. The computation of an LSP that spans across multiple autonomous systems is similar to the computation of an LSP that spans across multiple areas in the same autonomous system, with a few differences. One of the differences is that when a PCE sends a PCRep to a requesting PCE that is in a different autonomous system, it does not send explicit hop-by-hop EROs (explicit route objects). Instead, it sends a loose ERO with path level characters such as cost metric. This ensures that information is hidden from different autonomous systems while the end-to-end LSP can still be established.

Another difference is that the PCE election concept does not apply across autonomous systems. In other words, if the PCE is in a different autonomous system, the requesting PCE does not perform a PCE election procedure. In addition, there is no need to carry the autonomous system number into the TE database. In one embodiment, the PCReq message and the corresponding seeds are sent to each viable autonomous system peer node.

Figure 8:
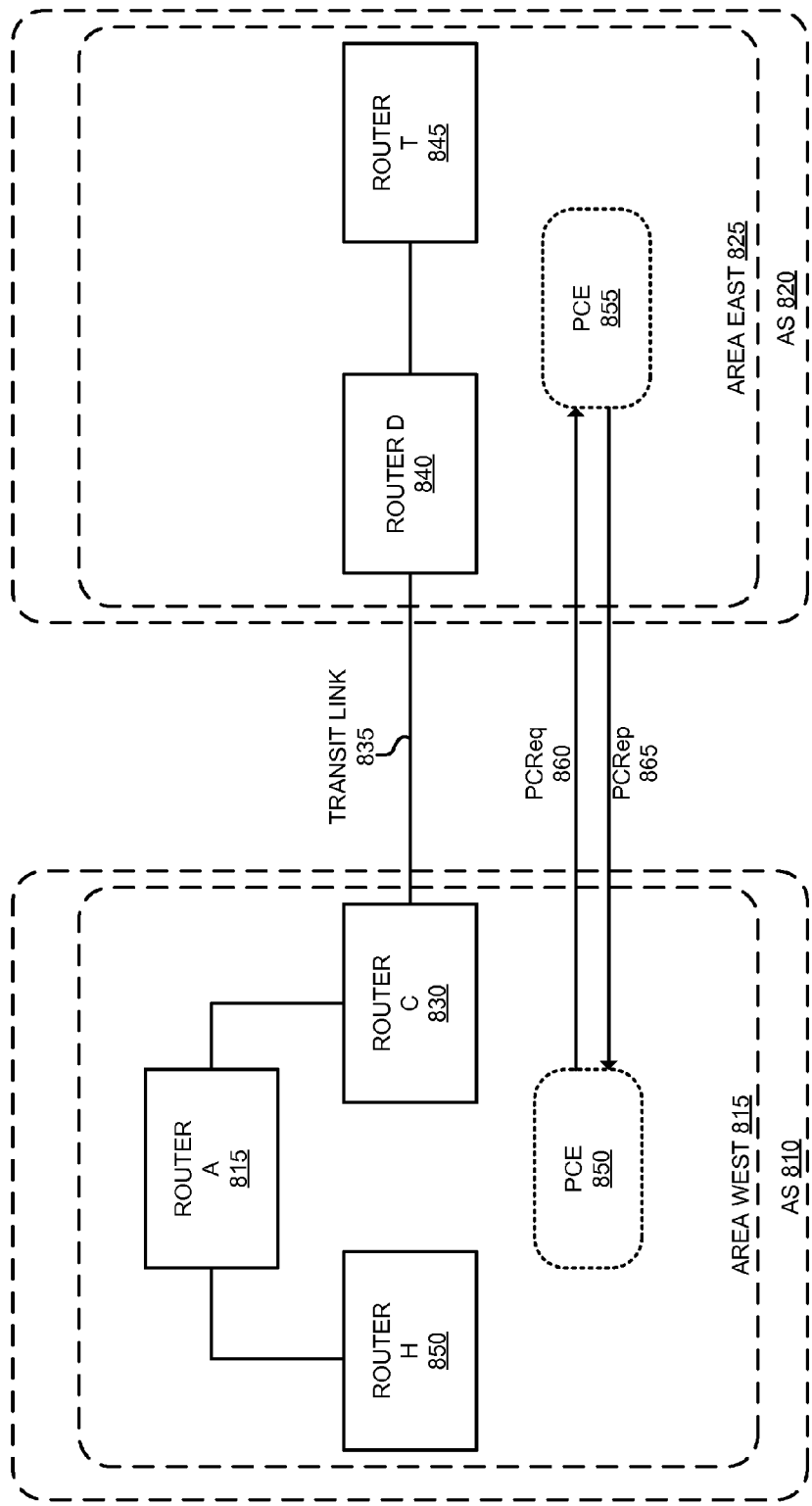
FIG. 8 illustrates an exemplary network where a constraint-based LSP spans across multiple areas in multiple autonomous systems according to one embodiment.

Another difference is that, unlike a multiple-area topology where a border router sits over both areas, two autonomous system border routers need a transit link to connect them together. The transit link needs to be considered for an autonomous system border router (ASBR) when it is to send a PCReq message to its peer ASBR. The transit link's characteristics such as metric, hop count, bandwidth, must also be taken into account of the seed value. For example, FIG. 8 illustrates a network where a constraint-based LSP spans across multiple areas in multiple autonomous systems. As illustrated in FIG. 8, the area west 815 of the autonomous system 810 includes the headend router 850, the router A 815, the router C 830, and the PCE 850, and the area east 825 of the autonomous system 820 includes the router D 840, the tailend router T 845, and the PCE 855. The router C 830 and the router D 840 are autonomous system border routers and are connected by the transit link 835. The PCE 850 transmits a PCReq message 860 to the PCE 855 which considers the characteristics of the transit link 835. The PCE 855 considers the transit link 835 when it computing the path to the tailend router T 845 and responds with a PCRep message 865 to the PCE 850.

Figure 9:
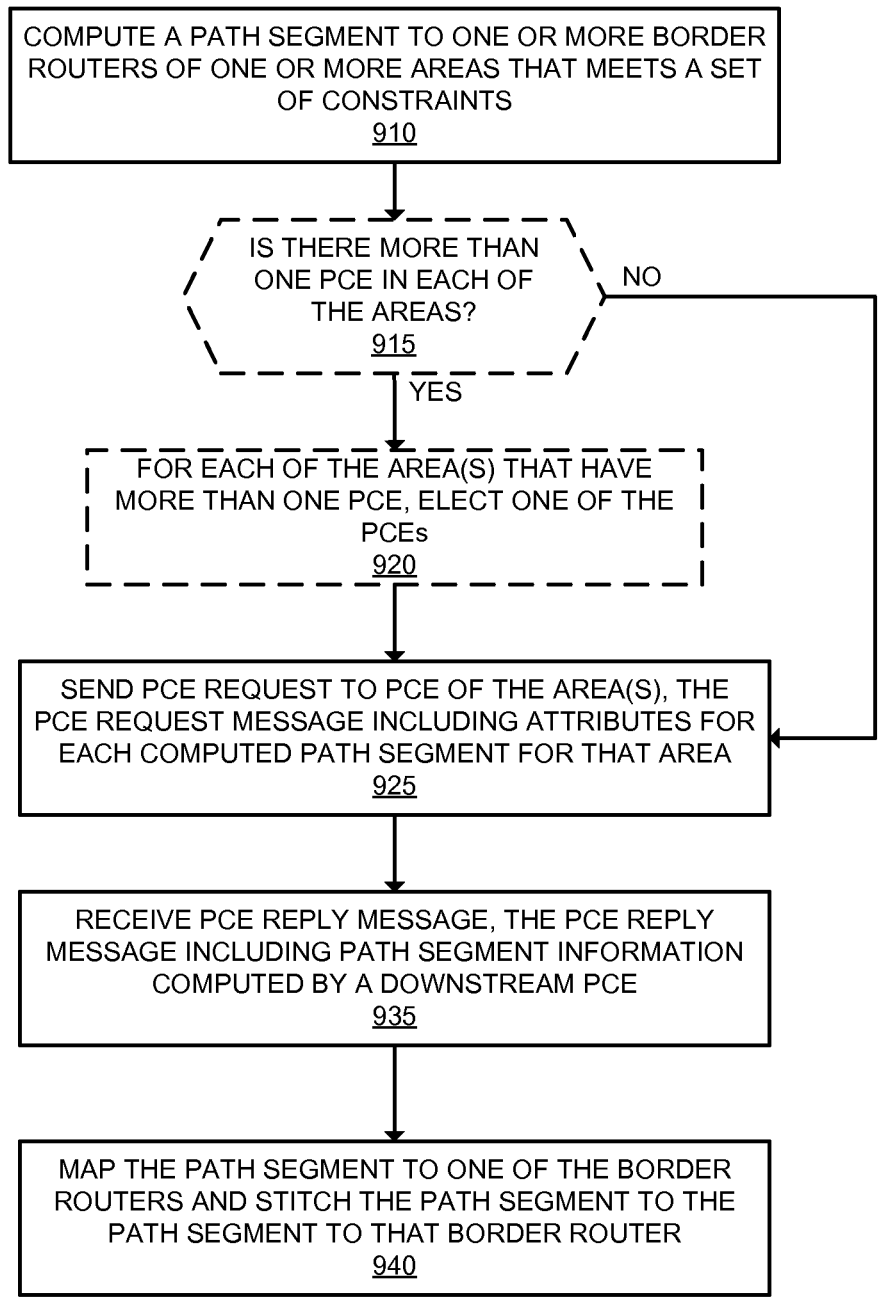
FIG. 9 is a flow diagram illustrating exemplary operations for computing a constraint-based LSP that spans across multiple areas according to one embodiment.

FIG. 9 is a flow diagram illustrating exemplary operations for computing a constraint-based LSP that spans across multiple areas according to one embodiment. At operation 910, a PCE computes a path segment to one or more border routers of one or more areas that meets a set of constraints. The PCE may be in the headend area and may initiate the computation. The PCE may also be in an intermediate area or in a tailend area. If in an intermediate area or the tailend area, the PCE may compute the path segments in response to receiving a path computation request message from a different PCE in a different area, which may be in a different autonomous system. The path computation request message includes one or more path segment attributes for one or more path segments that were computed by the requesting PCE and is used by the PCE when computing the path segments to its border routers. Flow moves from operation 910 to operation 915.

At operation 915, which is optional, the PCE determines whether there is more than one PCE in each of the areas. If there is not, then flow moves to operation 925. If there is, then flow moves to operation 920 and for each of the area(s) that have more than one PCE, the requesting PCE elects one of the PCEs (e.g., selects the PCE within the router having the highest or lowest router ID). Flow moves from operation 920 to operation 925. If the areas are in different autonomous systems, in one embodiment the operations of 915 and 920 are not performed.

At operation 925, the requesting PCE sends a path computation request message to the PCE in each of the area(s). The path computation request message includes attributes for each computed path segment computed path segment for that area. The path computation request message also includes the path request information (e.g., the set of constraints for the LSP). In one embodiment, the path computation request message includes the PCReq relay content extension illustrated in FIG. 210 to encode the attributes for the computed path segments. Flow moves to operation 935.

At operation 935, the requesting PCE receives a path computation reply message in response to the transmitted path computation request message. The path computation reply message includes the path segment information that is computed by a downstream PCE. Flow then moves to operation 940.

In one embodiment, if the path computation reply message was received from a downstream PCE that is in the same autonomous system, the path computation reply message includes an explicit ERO; however if the path computation reply message was received from a downstream PCE that is in a different autonomous system, the path computation reply message includes a loose ERO. If the path computation reply includes a loose ERO, the requesting PCE recovers the path segment represented by the loose ERO. In one embodiment, the border router stores a record of the path segment (a pre-computed ERO). When the reservation request (e.g., RSVP request) arrives into the border router it already includes the EROs that are stored locally. This approach works quickly but requires an RSVP implementation change. In another embodiment, the border router does not store the explicit path segment; rather it is stateless. When requested, the border router will query its own PCE to determine the EROs. This will result in the same EROs as the pre-computed ERO approach, assuming that the topology has not changed.

At operation 940, the requesting PCE maps the path segment to one of the border routers and stitches the segment identified in the path computation reply message to the path segment to that border router. If the requesting PCE is in the headend area, then the stitched path will be the complete path from the headend to the tailend. If the requesting PCE is in an intermediate area, then the stitched path will be a segment of the complete path and the PCE will generate a path computation reply message with the path segment information to send to its requesting PCE.

Figure 10:
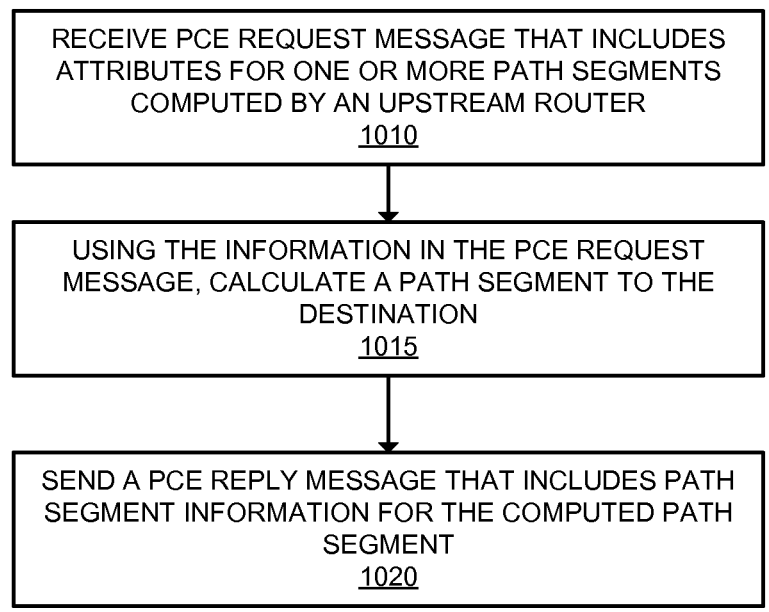
FIG. 10 is a flow diagram illustrating exemplary operations performed by a PCE in a destination area for computing a constraint-based LSP that spans across multiple areas according to one embodiment.

FIG. 10 is a flow diagram illustrating exemplary operations performed by a PCE in a destination area for computing a constraint-based LSP that spans across multiple areas according to one embodiment. At operation 1010, the PCE receives a path computation request message that includes attributes for one or more path segments that were computed by a different PCE on an upstream router. In one embodiment, the path computation request message includes the PCReq relay content extension illustrated in FIG. 210 to encode the attributes for the computed path segments. Flow then moves to operation 1015 where the PCE uses the information in the path computation request message to compute a path segment to the destination. Flow then moves to operation 1020 and the PCE sends a PCE reply message that includes path segment information for the computed path segment.

In one embodiment, backup LSPs, bypass LSPs, or pass re-optimization, or any other path computation that requires the knowledge of an existing LSP has the information of that LSP included with the PCReq message and its path segment information. In the case where the LSP spans across multiple autonomous systems, the upstream router hides the path segment detail from the downstream router.

In one embodiment, shared risk link group (SRLG) handling is no different than that of a single autonomous system single area path computation. Thus, provided that the SRLG information is available (e.g., through GMPLS (Generalized Multiprotocol Label Switching)), each relayed PCE can compute the correct PCE segment and the end-to-end path should meet the SRLG requirement.

As described herein, operations may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., router(s)). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable communication media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device. Of course, one or more parts of an embodiment of the invention may be implemented using different combinations of software, firmware, and/or hardware.

While the flow diagrams in the figures show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method in a router for participating in computation of a constraint-based label switched path (LSP) that spans a plurality of areas to reach a destination, the router included within a first one of the plurality of areas, the method comprising the steps of:
   computing a path segment that meets a set of one or more constraints to at least one border router of the first area, wherein the at least one border router lies in a path necessary to reach the destination;
   transmitting a path computation request message to a path computation element in a second one of the plurality of areas, wherein the path computation request message includes a set of one or more attributes for each computed path segment including a cost of each computed path segment and a hop-count of each computed path segment, wherein the set of attributes for each computed path segment are used by the path computation element to compute one or more path segments towards the destination of the constraint-based LSP;
   receiving a path computation reply message from the path computation element that specifies a set of one or more computed path segments that meet the set of constraints and that were computed by one or more path computation elements downstream from the router, wherein a set of attributes included in the path computation reply message includes cost and hop-count for each one of the set of path segments to the destination computed by the router in the first area; and
   stitching at least one of the set of computed path segments that are specified in the path computation reply message with the path segment computed by the router to form at least part of the constraint-based LSP.

2. The method of claim 1, wherein the step of computing the path segment that meets the set of constraints to at least one border router of the first area is responsive to receiving a path computation request message from a different router that includes a set of one or more path segment attributes for a set of one or more path segments computed by the different router.

3. The method of claim 2, wherein the path computation request message transmitted to the path computation element in the second area includes the set of path segment attributes for the set of path segments that were computed by the different router.

4. The method of claim 3, wherein the set of attributes for each computed path segment further includes bandwidth and admin-group.

5. The method of claim 1, further comprising the step of:
   initiating a timer for receiving a path computation reply message in response to the transmitted path computation request message.

6. The method of claim 1, wherein the second area is in a different autonomous system than the first area.

7. A method in a router for participating in computation of a constraint-based label switched path (LSP) that spans a plurality of areas to reach a destination, wherein the router resides in a first one of the plurality of areas and the destination is in the first area, the method comprising the steps of:
   receiving a path computation request message from a router residing in a second one of the areas, the path computation request message including a set of one or more attributes for each of a set of one or more path segments that were computed by the router in the second area to a set of one or more border routers including a cost of each of the set of path segments and a hop-count of each of the set of path segments;
   computing a set of one or more path segments to the destination using the set of attributes for each of the set of path segments computed by the router residing in the second area; and
   transmitting a path computation reply message to the router residing in the second area, the path computation reply message specifying the set of computed path segments to the destination and a set of one or more attributes for each computed path segment to the destination, and wherein the set of attributes included in the path computation reply message includes cost and hop-count for each one of the set of path segments to the destination computed by the router in the first area.

8. The method of claim 7, wherein the router residing in the second area is in a same autonomous system as the router residing in the first area.

9. The method of claim 7, wherein the router residing in the second area is in a different autonomous system as the router residing in the first area, and wherein the set of one or more border routers are autonomous system border routers (AS-BRs) and wherein the router residing in the first area is an ASBR.

10. The method of claim 9, wherein the step of computing the set of one or more path segments to the destination also considers a set of one or more characteristics of a link between each border router and the router residing in the first area.

11. An apparatus to participate in computation of a constraint-based label switched path (LSP) that spans a plurality of areas to reach a destination, the apparatus comprising:
    a router configured to perform the following:
       compute a path segment that meets a set of one or more constraints to at least one border router of the first area, wherein the at least one border router lies in a path necessary to reach the destination;
       transmit a path computation request message to a path computation element in a second one of the plurality of areas, wherein the path computation request message includes a set of one or more attributes for each computed path segment including a cost of each computed path segment and a hop-count of each computed path segment, wherein the set of attributes for each computed path segment are used by the path computation element to compute one or more path segments towards the destination of the constraint-based LSP;
       receive a path computation reply message from the path computation element that specifies a set of one or more computed path segments that meet the set of constraints and that were computed by one or more path computation elements downstream from the router; and
       stitch at least one of the set of computed path segments that are specified in the path computation reply message with the path segment computed by the router to form at least part of the constraint-based LSP.

12. The apparatus of claim 11, wherein the router is to compute the path segment that meets the set of constraints to at least one border router of the first area responsive to receipt of a path computation request message from a different router that includes a set of one or more path segment attributes for a set of one or more path segments computed by the different router.

13. The apparatus of claim 12, wherein the path computation request message that is to be transmitted to the path computation element in the second area is to include the set of path segment attributes for the set of path segments that were computed by the different router.

14. The apparatus of claim 13, wherein the set of path segment attributes for each computed path segment further includes bandwidth and admin-group.

15. The apparatus of claim 11, wherein the router is further configured to initiate a timer for receipt of a path computation reply message in response to the path computation request message that is to be transmitted.

16. The apparatus of claim 11, wherein the second area is in a different autonomous system than the first area.

17. An apparatus to participate in computation of a constraint-based label switched path (LSP) that spans a plurality of areas to reach a destination, the apparatus comprising:
a router configured to perform the following:
receive a path computation request message from a router residing in a second one of the areas, the path computation request message to include a set of one or more attributes for each of a set of one or more path segments that were computed by the router in the second area to a set of one or more border routers including a cost of each of the set of path segments and a hop-count of each of the set of path segments;
compute a set of one or more path segments to the destination using the set of attributes for each of the set of path segments computed by the router residing in the second area; and
transmit a path computation reply message to the router residing in the second area, the path computation reply message to specify the set of computed path segments to the destination and a set of one or more attributes for each computed path segment to the destination, wherein the set of attributes included in the path computation reply message includes cost and hop-count for each one of the set of path segments to the destination computed by the router in the first area.

18. The apparatus of claim 17, wherein the set of attributes included in the path computation reply message is to include cost and hop-count for each one of the set of path segments to the destination computed by the router in the first area.

19. The apparatus of claim 17, wherein the router residing in the second area is to be in a same autonomous system as the router residing in the first area.

20. The apparatus of claim 17, wherein the router residing in the second area is to be in a different autonomous system as the router residing in the first area, and wherein the set of one or more border routers are autonomous system border routers (ASBRs) and wherein the router residing in the first area is an ASBR.

21. The apparatus of claim 20, wherein the router is to consider a set of one or more characteristics of a link between each border router and the router residing in the first area to compute the set of one or more path segments to the destination.

\* \* \* \* \*

UNITED STATES PATENT AND TRADEMARK OFFICE
CERTIFICATE OF CORRECTION

PATENT NO. : 8,837,292 B2
APPLICATION NO. : 12/983123
DATED : September 16, 2014
INVENTOR(S) : Lu et al.

It is certified that error appears in the above-identified patent and that said Letters Patent is hereby corrected as shown below:

On the Title Page, in item (52), under "U.S. Cl.", in Column 1, Line 2, delete "H01L" and insert -- H04L --, therefor.

In the Specification

In Column 8, Line 16, delete "list" and insert -- list. --, therefor.

Signed and Sealed this
Twenty-eighth Day of April, 2015

Michelle K. Lee
*Director of the United States Patent and Trademark Office*